(12) United States Patent
Kim et al.

(10) Patent No.: US 10,170,538 B2
(45) Date of Patent: Jan. 1, 2019

(54) MIS CAPACITOR

(71) Applicant: KOREA ELECTRONICS TECHNOLOGY INSTITUTE, Gyeonggi-do (KR)

(72) Inventors: Jun Chul Kim, Gyeonggi-do (KR); Dong Su Kim, Gyeonggi-do (KR); Jong Min Yook, Gyeonggi-do (KR)

(73) Assignee: Korea Electronics Technology Institute (KR)

( * ) Notice: Subject to any disclaimer, the term of this patent is extended or adjusted under 35 U.S.C. 154(b) by 0 days.

(21) Appl. No.: 15/822,772

(22) Filed: Nov. 27, 2017

(65) Prior Publication Data

US 2018/0182842 A1 Jun. 28, 2018

(30) Foreign Application Priority Data

Dec. 23, 2016 (KR) .......................... 10-2016-0178282

(51) Int. Cl.
*H01L 29/94* (2006.01)
*H01L 49/02* (2006.01)
*H01G 4/06* (2006.01)

(52) U.S. Cl.
CPC .............. *H01L 28/60* (2013.01); *H01G 4/06* (2013.01)

(58) Field of Classification Search
CPC ... H01L 21/334; H01L 21/3105; H01L 28/60; H01L 49/02; H01L 29/94
See application file for complete search history.

(56) References Cited

U.S. PATENT DOCUMENTS

| 4,645,564 | A  | * | 2/1987 | Morie | H01L 27/10829 148/DIG. 50 |
| 6,784,069 | B1 | * | 8/2004 | Patraw | H01L 21/31111 257/296 |
| 2002/0195683 | A1 | * | 12/2002 | Kim | H01L 21/28194 257/532 |
| 2006/0060977 | A1 | * | 3/2006 | Kawanoue | H01L 21/76843 257/762 |
| 2012/0273861 | A1 | * | 11/2012 | Cheng | H01L 21/02181 257/310 |
| 2013/0146959 | A1 | * | 6/2013 | Cheng | H01L 29/66181 257/310 |
| 2016/0225919 | A1 | * | 8/2016 | Chen | H01L 29/495 |

* cited by examiner

*Primary Examiner* — Fazli Erdem
(74) *Attorney, Agent, or Firm* — Mendelsohn Dunleavy, P.C.

(57) ABSTRACT

In one embodiment of the present invention, there is provided an MIS capacitor, including: a lower electrode formed with a semiconductor substrate having electrical conductivity and through which an electrical signal passes at a lower surface thereof; an insulating layer formed on the lower electrode; an upper electrode formed on the insulating layer and through which the electrical signal passes at an upper surface thereof; and a first conductive layer formed on side surfaces of the lower electrode so that the electrical signal passing the lower surface and an upper surface of the lower electrode passes along the side surfaces of the lower electrode, wherein the first conductive layer has electro conductivity higher than the electro conductivity of the lower electrode.

12 Claims, 8 Drawing Sheets

MIS CAPACITOR

CROSS REFERENCE TO RELATED APPLICATION

The present application claims priority to Korean Patent Application No. 10-2016-0178282, filed Dec. 23, 2016, the entire contents of which is incorporated herein for all purposes by this reference.

BACKGROUND OF THE INVENTION

Field of the Invention

The present invention relates generally to an MIS capacitor.

Description of the Related Art

Resistors, capacitors, and inductors are passive elements that generally constitute a circuit. Particularly, capacitors and inductors are widely used for various filters, matching circuits, etc. In addition, according to an operation frequency, performance thereof changes, and in a case of a circuit operated within a specific frequency range, quality factors (Q factor) of a capacitor and an inductor in a corresponding frequency become important.

Meanwhile, as a degree of integration in a circuit increases, metal-insulator-silicon or metal-insulator-semiconductor capacitors having low electrical conductivity and using a silicon semiconductor substrate are used by using a semiconductor manufacturing process. In the related art, the metal-insulator-silicon capacitor and the metal-insulator-semiconductor capacitor are simply called as MIS capacitors, based on the abbreviations of the materials of the capacitors.

The foregoing is intended merely to aid in the understanding of the background of the present invention, and is not intended to mean that the present invention falls within the purview of the related art that is already known to those skilled in the art.

SUMMARY OF THE INVENTION

Accordingly, the present invention has been made keeping in mind the above problems occurring in the related art, and an object according to an embodiment of the present invention is to provide an MIS capacitor including a lower electrode formed with a semiconductor substrate having low electrical conductivity and a conductive layer having high electrical conductivity formed on side surfaces of the lower electrode.

In addition, another object of the present invention is to provide an MIS capacitor including a conductive layer formed to cover, in addition to the sides surfaces of the lower electrode, an area of an upper surface of the lower electrode on which an insulating layer is not formed.

In addition, still another object of the present invention is to provide an MIS capacitor in an array form in which an insulating layer is formed on a single lower electrode and a plurality of upper electrodes is formed on the insulating layer, or a plurality of insulators is formed on a single lower electrode and at least one upper electrode is formed on each of the plurality of insulators.

An MIS capacitor according to an embodiment of the present invention includes: a lower electrode formed of a semiconductor substrate having electrical conductivity and through which an electrical signal passes at a lower surface thereof; an insulating layer formed on the lower electrode; an upper electrode formed on the insulating layer and through which the electrical signal passes at an upper surface thereof; and a first conductive layer formed on side surfaces of the lower electrode so that the electrical signal passing a lower surface and the upper surface of the lower electrode passes along the side surfaces of the lower electrode, wherein the first conductive layer has electro conductivity higher than the electro conductivity of the lower electrode.

In addition, the insulating layer may be formed to have an area identical to an area of the lower electrode, the upper electrode may be formed to have an area smaller than the area of the insulating layer, and the first conductive layer may be configured extend to side surfaces of the insulating layer.

In addition, the MIS capacitor may further include a third conductive layer connected to the first conductive layer and formed on the lower surface of the lower electrode so that the electrical signal passes therethrough.

In addition, the insulating layer may be formed to have an area smaller than the area of the lower electrode, and the MIS capacitor may further include: a second conductive layer formed on an area of the upper surface of the lower electrode on which the insulating layer is not formed, and electrically connected to the first conductive layer so that the electrical signal flowing along the first conductive layer flows to the upper electrode by passing along the upper surface of the lower electrode, wherein the second electrode has electro conductivity higher than the electro conductivity of the lower electrode.

In addition, the upper electrode may comprise a plurality of upper electrodes formed on the insulating layer such that the upper electrodes are spaced apart from each other.

In addition, the insulating layer may comprise a plurality of insulators formed on the lower electrode such that the insulators are spaced apart from each other, and at least one upper electrode may be formed on each of the plurality of insulators.

The advantages and the features of the present invention will be apparently comprehended by those skilled in the art based on the embodiments, which are detailed later in detail, together with accompanying drawings.

The terminology and words used herein and appended claims should be not interpreted as the meanings of commonly used dictionaries, but interpreted as having meanings according to the technical sprit of the present invention under the principle that the concepts of the terminology and the words can be defined by the inventor in order to explain the present invention in the best mode.

According to an embodiment of the present invention, electrical conductivity of a lower electrode of an MIS capacitor is improved by forming a conductive layer having high electrical conductivity on side surfaces of the lower electrode formed with a conductive semiconductor substrate.

In addition, as the electrical conductivity of the lower electrode is improved, energy loss of an electrical signal generated while passing the MIS capacitor is decreased, thus a quality factor (Q factor) in a high frequency area is improved.

In addition, the quality factor (Q factor) is improved since the electrical signal passes along the conductive layer due to a skin effect in a high frequency area by forming the conductive layer to cover the entire side surfaces of the lower electrode.

In addition, since a distance from a point at which the conductive layer is in contact with the insulating layer to an upper electrode and through which the electrical signal passes is decreased by the conductive layer formed to cover an area of the upper surface of the lower electrode on which the insulating layer is not formed, energy loss of the electrical signal generated while passing the MIS capacitor is decreased, thus the quality factor (Q factor) in a high frequency area is improved.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

The objects, features and advantages of the present invention will be more clearly understood from the following detailed description of the preferred embodiments taken in conjunction with the accompanying drawings. Throughout the accompanying drawings, the same reference numerals are used to designate the same or similar components. Further, in the following description, the terms "first", "second", "a first side", "a second side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, embodiments of the present invention will be described in detail with reference to the accompanying drawings. Throughout the drawings, the same reference numerals will refer to the same or like parts.

Figure 1:
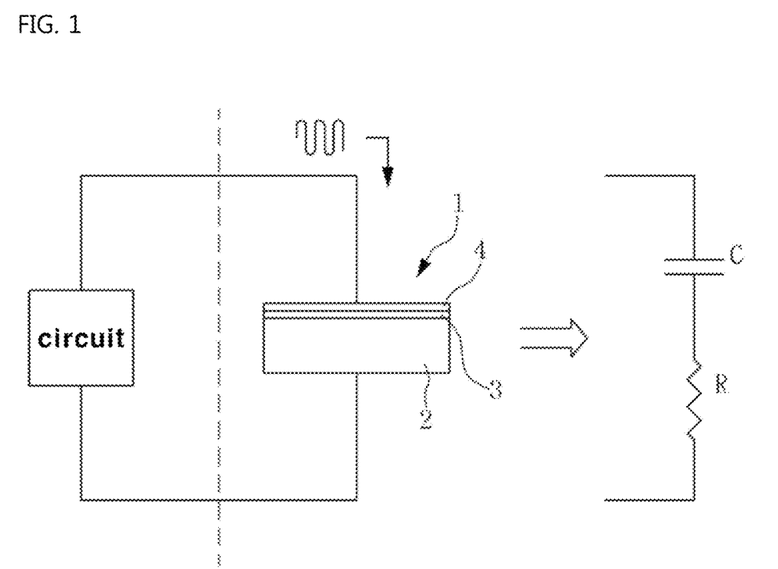
FIG. 1 is a view showing a conventional MIS capacitor.

FIG. 1 is a view showing a conventional MIS capacitor 1. As shown in FIG. 1, the conventional MIS capacitor 1 is configured with a lower electrode 2, an insulating layer 3, and an upper electrode 4. The upper electrode 4 is formed of metal materials, and the lower electrode 2 is formed of a conductive semiconductor substrate such as silicon substrate in which a dopant is highly concentrated so that the silicon substrate has conductivity. The MIS capacitor 1 is connected to an external circuit at an upper surface of the upper electrode 4 and at lower surface of the lower electrode 2, thus an electrical signal passes therethrough.

The conventional MIS capacitor 1 may be manufactured to have a precise capacitance value by using a semiconductor manufacturing process, and a thin-film capacitor may be also manufactured. However, due to low electrical conductivity of the conductive silicon substrate (about 20000 S/m), the quality factor (Q factor) of the conventional MIS capacitor is low in a high frequency area. Particularly, since the quality factor of the conventional MIS capacitor is low in an area equal to or greater than a 3 GHz frequency, available usage range thereof is restricted to an area within a 3 GHz frequency.

As shown in FIG. 1, when a circuit model is generated by connecting the conventional MIS capacitor 1 to a capacitor C and a resistor R, most of resistance occurs by the conductive silicon substrate having low electrical conductivity. Since a quality factor of a capacitor is inversely proportional to a resistor R, the quality factor may be improved by decreasing the resistor R. Accordingly, the electrical conductivity of the conductive silicon substrate should be improved.

Hereafter, with reference to the accompanied drawing, a first embodiment of the present invention will be described in detail.

Figure 2:
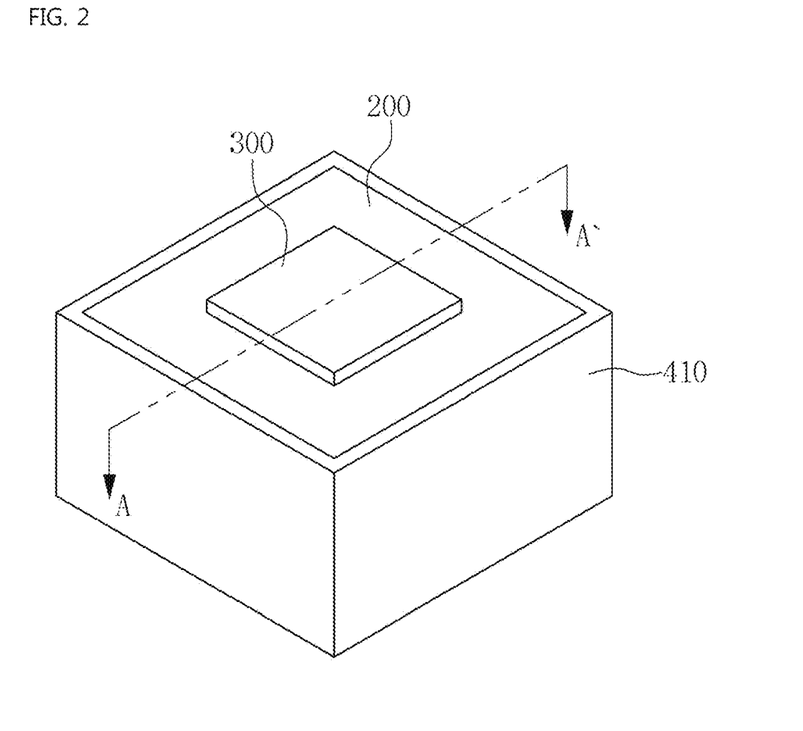
FIG. 2 is a perspective view of an MIS capacitor according to a first embodiment of the present invention.
Figure 3:
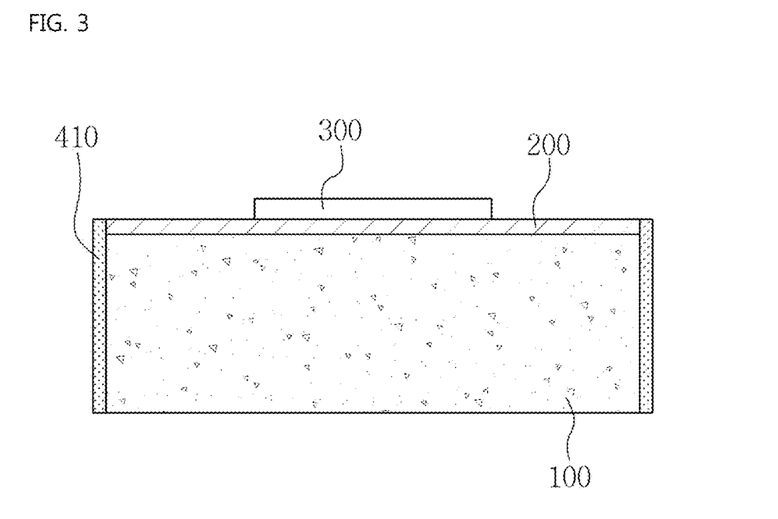
FIG. 3 is a cross-sectional view taken along the line A-A' of FIG. 2.

FIG. 2 is a perspective view of an MIS capacitor according to a first embodiment of the present invention, and FIG. 3 is a cross-sectional view taken along the line A-A' of FIG. 2.

As shown in FIG. 2 and FIG. 3, the MIS capacitor according to the first embodiment of the present invention includes: a lower electrode 100 formed with a semiconductor substrate having electrical conductivity and through which an electrical signal passes at a lower surface thereof; an insulating layer 200 formed on the lower electrode 100; an upper electrode 300 formed on the insulating layer 200 and through which the electrical signal passes at an upper surface thereof; and a first conductive layer 410 formed on side surfaces of the lower electrode 100 so that the electrical signal passing between the lower surface and an upper surface of the lower electrode 100 flows along the side surfaces of the lower electrode 100. The first conductive layer 410 has electrical conductivity higher than the electrical conductivity of the lower electrode 100.

The lower electrode 100 is a semiconductor substrate such as silicon substrate including highly concentrated dopant thereby having electrical conductivity. The lower surface of the lower electrode 100 is connected to an external circuit (or to the ground GND) by using an adhesive element such as conductive epoxy, and the electrical signal passes through the lower surface of the lower electrode 100.

The insulating layer 200 is formed on the upper surface of the lower electrode 100. The insulating layer 200 has a very small thickness compared with a thickness of the lower electrode 100. The insulating layer 200 may be formed to cover the entire upper surface of the lower electrode 100. In other words, an area of the insulating layer 200 and an area of the lower electrode 100 may be identical. A capacitor with a low capacitance value may be implemented by forming the insulating layer 200 of materials such as $SiO_2$, $SiN_x$, $Al_2O_3$, etc. In addition, a capacitor with a high capacitance value may be implemented by forming the insulating layer 200 of materials such as $HfO_2$, BST, STO ZrO, $Ta_2O_5$, etc.

The upper electrode 300 is formed on the insulating layer 200, and an area thereof is determined according to a capacitance value to be manufactured. The upper electrode 300 is formed of metal materials or materials having high electrical conductivity such as Cu, Al, Ag, Au, etc. The upper electrode 300 is connected to an external circuit at an upper surface thereof so that the electrical signal passes through the upper surface of the upper electrode 300.

The first conductive layer 410 is formed on side surfaces of the lower electrode 100. The first conductive layer 410 is formed of materials having electrical conductivity higher than the electrical conductivity of the lower electrode 100. For example, the first conductive layer 410 may be formed of metal materials or metal alloy such as Cu (electrical conductivity: $5.96 \times 10^7$ S/m), Au (electrical conductivity: $4.10 \times 10^7$ S/m), Al (electrical conductivity: $3.50 \times 10^7$ S/m), etc.

The first conductive layer 410 is formed along the side surfaces of the lower electrode 100 from a lower part to an upper part of the side surfaces of the lower electrode 100. When the electrical signal passes between the upper electrode 300 and the lower electrode 100, the electrical signal may flow along the first conductive layer 410 rather than passing through the lower electrode 100 having low electrical conductivity. The low electrical conductivity of the lower electrode 100 may be compensated by forming the first conductive layer 410 on the side surfaces of the lower electrode 100.

The quality factor Q is inversely proportional to energy consumed by the electrical signal in a capacitor per cycle. In other words, when energy consumed by the electrical signal while passing the capacitor is decreased, the quality factor Q is improved.

Energy loss generated by the electrical signal while passing the first conductive layer 410 is smaller than energy loss generated by the electrical signal while passing through the lower electrode 100. This is because the lower electrode 100 has low electrical conductivity (in other words, high resistivity), and the first conductive layer 410 has high electrical conductivity (in other words, low resistivity).

Accordingly, since the electrical signal passing through the MIS capacitor according to the first embodiment of the present invention flows along the first conductive layer 410 having high electrical conductivity, energy consumed by the electrical signal per cycle in the MIS capacitor according to the first embodiment of the present invention is much lower than energy consumed by an electrical signal per cycle in the conventional MIS capacitor. Therefore, the quality factor Q of the capacitor is improved.

The first conductive layer 410 may be famed to cover the entire side surfaces of the lower electrode 100 or to cover partial side surfaces of the lower electrode 100. Although the first conductive layer 410 is formed on the partial side surfaces of the lower electrode 100, the electrical signal may flow along the first conductive layer 410 having high electrical conductivity. Thus, energy consumed by the electrical signal per cycle may be decreased whereby the quality factor Q of the capacitor is improved.

It is preferable for the first conductive layer 410 to be formed to cover the entire side surfaces of the lower electrode 100. Due to the skin effect, when a frequency of an electrical signal becomes high, most of the electrical signal flows through peripheral parts of a conductor. The electrical signal passing through the upper electrode 300 and the lower electrode 100 flows in a direction perpendicular to the lower surface of the lower electrode 100. Herein, the side surfaces of the lower electrode 100 correspond to skin of the conductor based on the direction where the electrical signal flows.

Accordingly, the first conductive layer 410 formed to cover the entire side surfaces of the lower electrode 100 becomes a path of the electrical signal in a high frequency area. When a high frequency electrical signal passes a capacitor, the electrical signal flows along the first conductive layer 410 due to the skin effect, thus, energy loss by the electrical signal per cycle is reduced. Therefore, the quality factor Q of the capacitor is improved.

In other words, by forming the first conductive layer 410 of materials having electrical conductivity higher than electrical conductivity of the lower electrode 100 on the side surfaces of the lower electrode 100, loss generated while the electrical signal passes through the lower electrode 100 may be decreased, thus the quality factor Q of the capacitor may be improved.

In detail, as shown in FIG. 2 and FIG. 3, in the MIS capacitor according to the first embodiment of the present invention, the insulating layer 200 is formed to have an area identical to an area of the lower electrode 100, the upper electrode 300 is formed to have an area smaller than the area of the insulating layer 200, and the first conductive layer 410 is configured to extend to side surfaces of the insulating layer 200.

The upper electrode 300 is formed on the insulating layer 200 to be internally spaced apart a predetermined distance from an end of the upper surface of the lower electrode 100. Such a distance is required for a margin in a dicing process of the semiconductor substrate during a semiconductor manufacturing process. In other words, side surfaces of the upper electrode 300 are spaced apart from the side surfaces of the lower electrode 100, and the area of the upper electrode 300 is formed to be smaller than the area of the lower electrode 100. In other words, the area of the upper electrode 300 is smaller than the area of the insulating layer 200.

Since the insulating layer 200 formed on the lower electrode 100 has a very small thickness compared with the thickness of the lower electrode 100, the first conductive layer 410 formed on the side surfaces of the lower electrode 100 may be formed on side surfaces of the insulating layer 200 in continuation of the side surfaces of the lower electrode 100. Accordingly, a distance from an upper part of the first conductive layer to the upper electrode 300 is decreased as much as the height of the insulating layer 200, thereby a path through which the electrical signal passes the lower electrode 100 is decreased. Since the distance or the flow path through which the electrical signal passes the lower electrode 100 having low electrical conductivity is decreased, energy loss of the electrical signal is decreased, and thereby the quality factor Q of the capacitor is improved.

Figure 4:
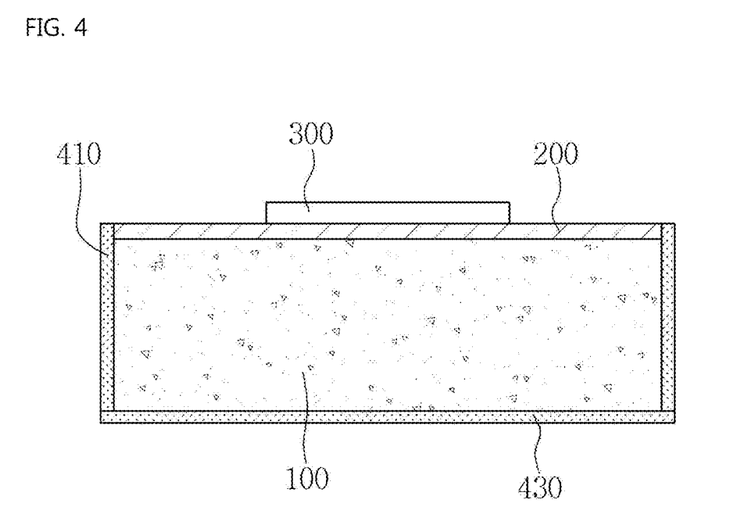
FIG. 4 is a cross-sectional view of the MIS capacitor according to the first embodiment of the present invention to which a third conductive layer is added.

FIG. 4 is a cross-sectional view of the MIS capacitor according to the first embodiment of the present invention to which a third conductive layer 430 is added.

As shown in FIG. 4, a third conductive layer 430 is connected to the first conductive layer 410, and formed on the lower surface of the lower electrode 100 so that the electrical signal passes through a lower surface of the third conductive layer 430. The third conductive layer 430 is connected to a lower part of the first conductive layer 410 so that the electrical signal passing through the lower surface of the third conductive layer 430 directly flows to the first conductive layer 410. The third conductive layer 430 may be formed of materials identical to the materials of the first conductive layer 410. The third conductive layer 430 may be formed to be integrated with the first conductive layer 410.

Hereinafter, with reference to accompanied drawings, a second embodiment of the present invention will be described in detail, and descriptions overlapped with the described first embodiment will be omitted.

Figure 5:
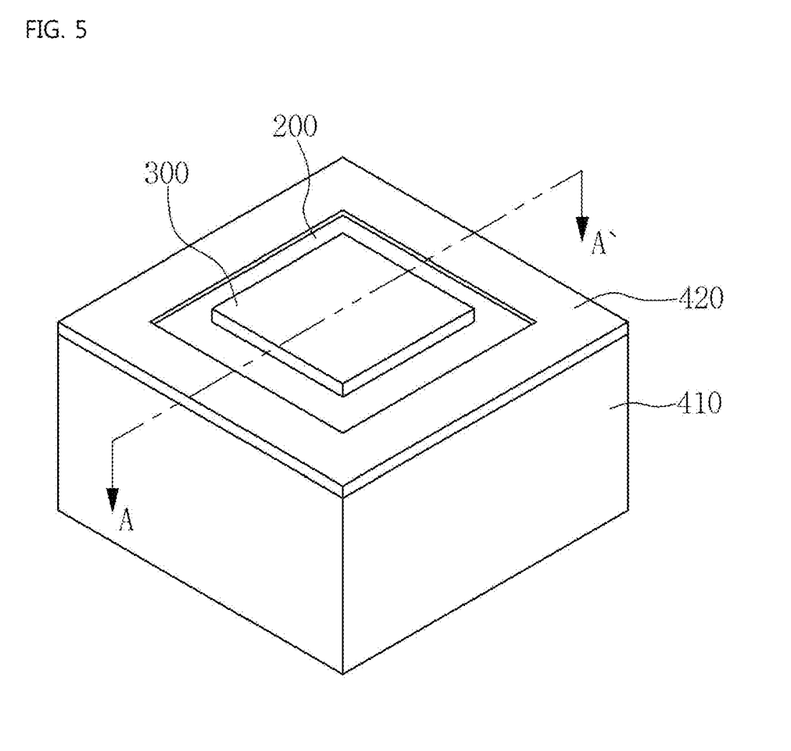
FIG. 5 is a perspective view of an MIS capacitor according to a second embodiment of the present invention.
Figure 6:
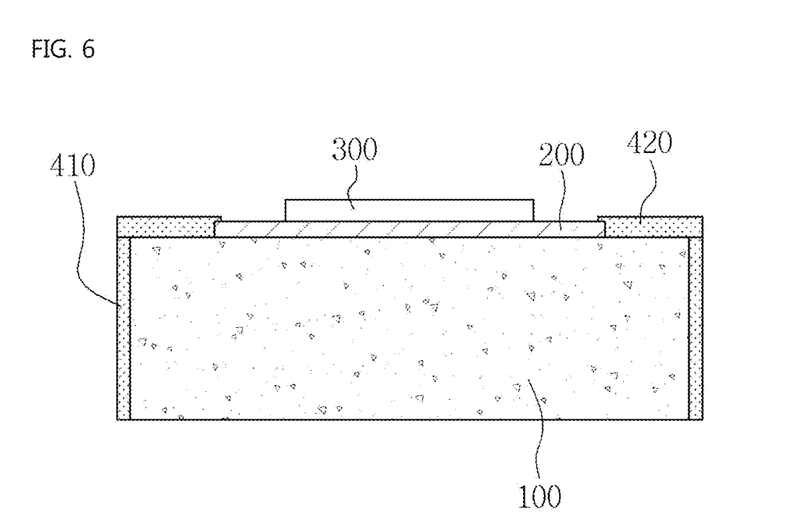
FIG. 6 is a cross-sectional view taken along the line A-A' of FIG. 5.

FIG. 5 is a perspective view of an MIS capacitor according to a second embodiment of the present invention, and FIG. 6 is a cross-sectional view taken along the line A-A' of FIG. 5.

As shown in FIG. 5 and FIG. 6, the MIS capacitor according to the second embodiment of the present invention includes the upper electrode 300, the insulating layer 200, the lower electrode 100, and the first conductive layer 410 which are described in the first embodiment, and further includes a second conductive layer 420.

In the MIS capacitor according to the second embodiment of the present invention, the insulating layer 200 is formed to have an area smaller than the area of the lower electrode 100. The second conductive layer 420 is formed on an area of the upper surface of the lower electrode 100 on which the insulating layer 200 is not formed, and electrically connected to the first conductive layer 410 so that the electrical signal flowing along the first conductive layer 410 flows to the upper electrode 300 by flowing along the upper surface of the lower electrode 100. The second conductive layer 420 is formed of materials having electrical conductivity higher than the electrical conductivity of the lower electrode 100.

The insulating layer 200 may be formed to be internally spaced apart a predetermined distance from an end of the upper surface of the lower electrode 100. In other words, the area of the insulating layer 200 is formed to be smaller than the area of the lower electrode 100, and side surfaces of the insulating layer 200 are formed to be spaced apart from the end of the upper surface of the lower electrode 100. When the area of the insulating layer 200 is larger than the area of the upper electrode 300, the insulating layer 200 between the upper electrode 300 and the lower electrode 100 may function sufficiently, thus the area of the insulating layer 200 may be formed to be larger than the area of the upper electrode 300 and smaller than the area of the lower electrode 100.

Since the insulating layer 200 is not formed to cover the entire upper surface of the lower electrode 100, an area on which the insulating layer 200 is not formed is present on the upper surface of the lower electrode 100. The second conductive layer 420 is formed on such an area of the upper surface of the lower electrode 100 on which the insulating layer 200 is not formed. The second conductive layer 420 is connected to the upper part of the first conductive layer 410 so that the electrical signal flowing along the first conductive layer 410 flows to the upper electrode 300 by passing along the upper surface of the lower electrode 100.

The second conductive layer 420 is connected to the upper part of the first conductive layer 410 and in contact with the side surfaces of the insulating layer 200. In detail, as shown in FIG. 6, the second conductive layer 420 may be formed to cover a partial circumference of the insulating layer 200. Since the second conductive layer 420 is formed to be connected to the upper part of the first conductive layer 410 and in contact with the circumference of the insulating layer 200, the electrical signal flows from the upper part of the first conductive layer 410 to the circumference of the insulating layer 200 via the second conductive layer 420.

A distance from a part at which the second conductive layer 420 and the circumference of the insulating layer 200 are in contact therewith to the upper electrode 300 and through which the electrical signal flows is shorter than the distance from the upper part of the first conductive layer 410 to the upper electrode 300 and through which the electrical signal flows. Accordingly, the distance through which the electrical signal passes the lower electrode 100 having low electrical conductivity is decreased, and energy loss by the electrical signal generated by a resistance component of the capacitor is reduced, thereby the quality factor Q of the capacitor is improved.

Figure 7:
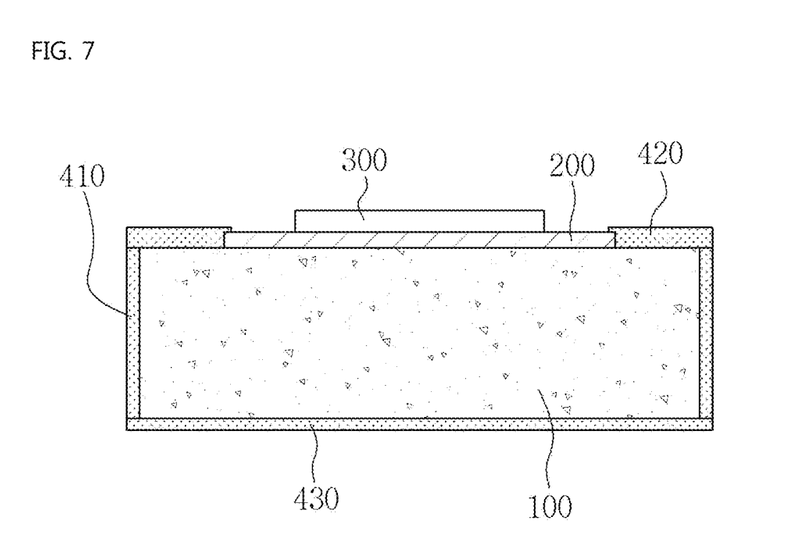
FIG. 7 is a cross-sectional view of the MIS capacitor according to the second embodiment of the present invention to which a third conductive layer is added.

FIG. 7 is a cross-sectional view of the MIS capacitor according to the second embodiment of the present invention to which a third conductive layer 430 is added.

As shown in FIG. 7, a third conductive layer 430 is connected to the first conductive layer 410, and formed on the lower surface of the lower electrode 100 so that the electrical signal passes through a lower surface of the third conductive layer 430. The third conductive layer 430 is connected to the lower part of the first conductive layer 410 so that the electrical signal passing through the lower surface of the third conductive layer 430 directly flows to the first conductive layer 410. The third conductive layer 430 may be formed of materials identical to the materials of the first conductive layer 410. The third conductive layer 430 may be formed to be integrated with the first conductive layer 410.

Hereinafter, with reference to accompanied drawings, a third embodiment and a fourth embodiment of the present invention will be described in detail, and descriptions overlapped with the described first embodiment and the second embodiment will be omitted.

In the third embodiment and the fourth embodiment of the present invention, the MIS capacitor according to the described first embodiment and the second embodiment is provided in an array form.

Figure 8:
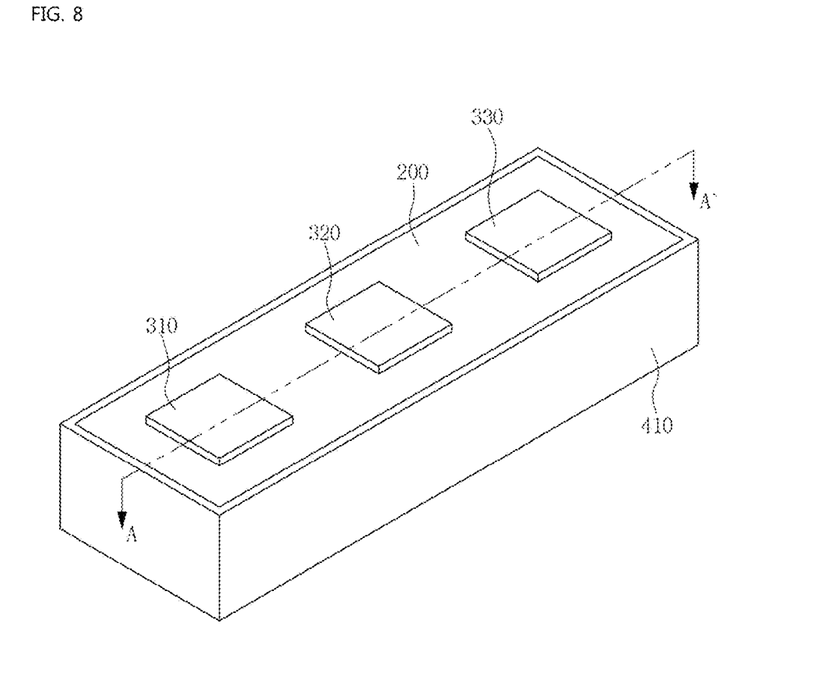
FIG. 8 is a perspective view of an MIS capacitor according to a third embodiment of the present invention.
Figure 9:
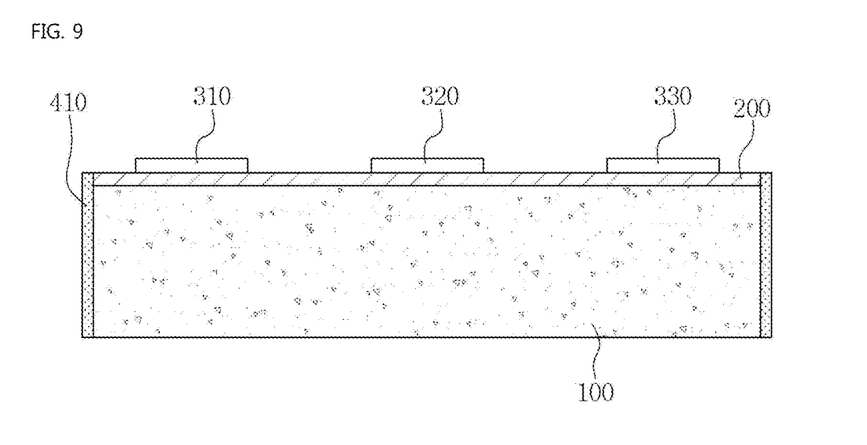
FIG. 9 is a cross-sectional view taken along the line A-A' of FIG. 8.

FIG. 8 is a perspective view of an MIS capacitor according to the third embodiment of the present invention, and FIG. 9 is a cross-sectional view taken along the line A-A' of FIG. 8.

As shown in FIG. 8 and FIG. 9, the MIS capacitor according to the third embodiment of the present invention includes the lower electrode 100, the insulating layer 200, the upper electrode 300, and the first conductive layer 410 which are described in the first embodiment. However, the insulating layer 200 is formed to have an area identical to the area of the lower electrode 100, and the upper electrode 300 is formed to have an area smaller than the area of the insulating layer 200, and comprises a plurality of upper electrodes formed on the insulating layer 200 such that the upper electrodes are spaced apart from each other.

The lower electrode 100 is formed with a single conductive semiconductor substrate, the insulating layer 200 is formed to cover the entire upper surface of the lower electrode 100, and a plurality of the upper electrodes 300 is formed on the insulating layer 200 such that the upper electrodes 300 are spaced apart from each other. For example, upper electrodes 310, 320, and 330 may be serially formed by being spaced apart a predetermined distance from each other. A first upper electrode 310 is connected to a circuit at an upper surface thereof, a second upper electrode 320 is connected to the circuit at an upper surface thereof, a third upper electrode 330 is connected to the circuit at an upper surface thereof, and the lower surface of the lower electrode 100 is connected to the ground GND, whereby a capacitor array with three capacitors is formed.

The first conductive layer 410 formed on the side surfaces of the lower electrode 100 and the side surfaces of the insulating layer 200 may decrease energy loss generated by the electrical signal while passing through the upper electrode 300 and the lower electrode 100 as described in the first embodiment, thus the quality factor Q of each capacitor is improved.

A third conductive layer (not shown) is formed on the lower surface of the lower electrode 100 so that the third conductive layer may function as the third conductive layer of the first embodiment.

Figure 10:
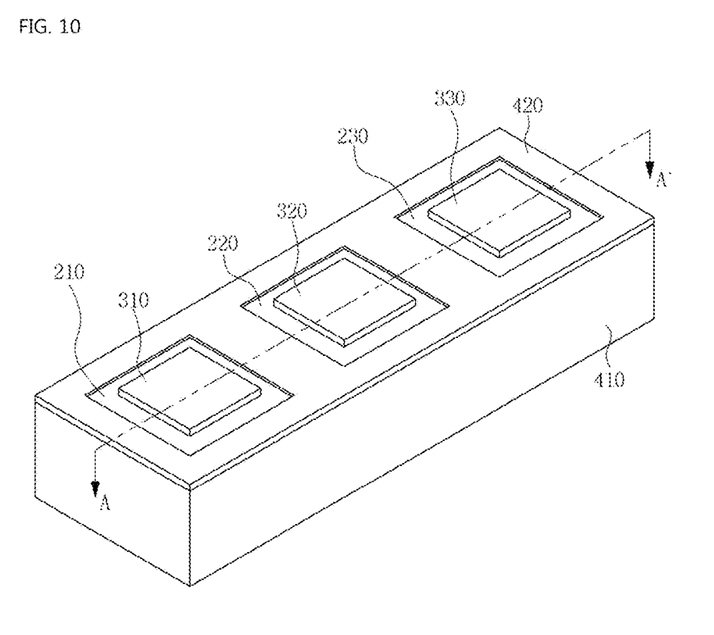
FIG. 10 is a perspective view of an MIS capacitor according to a fourth embodiment of the present invention.
Figure 11:
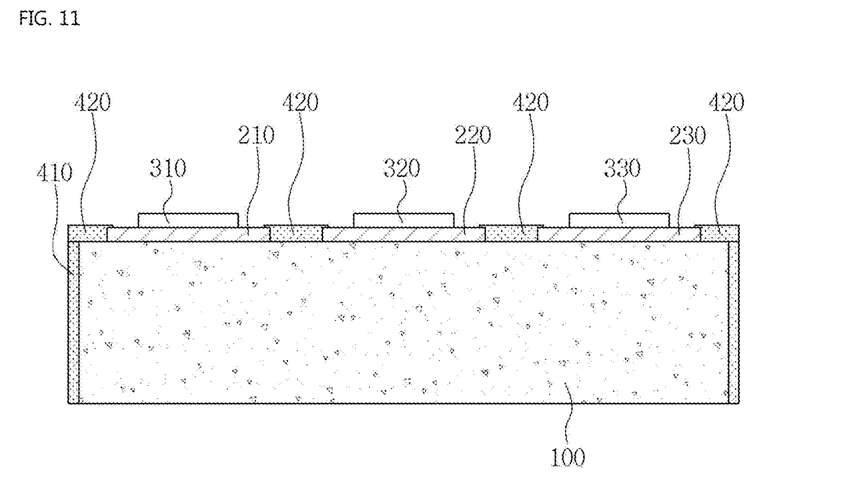
FIG. 11 is a cross-sectional view taken along the line A-A' of FIG. 10.

FIG. 10 is a perspective view of an MIS capacitor according to the fourth embodiment of the present invention, and FIG. 11 is a cross-sectional view taken along the line A-A' of FIG. 10.

As shown in FIG. 10 and FIG. 11, the MIS capacitor according to the fourth embodiment of the present invention includes the lower electrode 100, the insulating layer 200, the upper electrode 300, the first conductive layer 410, and the second conductive layer 420 as described in the first embodiment and the second embodiment. However, the insulating layer 200 is formed to have an area smaller than the area of the lower electrode 100, and comprises a plurality of insulators 200 spaced apart from each other. The upper electrode 300 is formed to have an area smaller than the area of the insulator 200, and at least one upper electrode 300 is formed on each of the plurality of insulators 200. The second conductive layer 420 is connected to the upper part of the first conductive layer 410, and in contact with each circumference of the plurality of insulators 200.

The lower electrode 100 is formed with a single conductive semiconductor substrate, and the plurality of insulators 200 is formed on the lower electrode 100 to be spaced apart from each other, and at least one upper electrode 300 is formed on each of the plurality of insulators 200.

For example, insulators 210, 220, and 230 may be serially formed by being spaced apart a predetermined distance from each other, a first upper electrode 310 may be famed on a first insulator 210, a second upper electrode 320 may be formed on the second insulator 220, and a third upper electrode 330 may be formed on the third insulator 230. Alternatively, at least two upper electrodes 300 may be formed on the first insulator 210.

Each of the upper electrodes 310, 320, and 330 is connected to a circuit at each upper surface thereof, and the lower electrode 100 is connected to the ground GND at a lower surface thereof, whereby a capacitor array with three capacitors is formed.

The second conductive layer 420 is formed to be connected to the upper part of the first conductive layer 410, and in contact with each circumference of the plurality of insulators 200. In other words, the second conductive layer 420 is formed in an area where the plurality of insulators 200 is not formed on the upper surface of the lower electrode 100 (including areas between the isolated insulators), and formed to be in contact with the upper part of the first conductive layer and each circumference of the plurality of insulators 200.

By forming the second conductive layer 420, a distance through which the electrical signal passes the lower electrode 100 having low electrical conductivity is decreased. In other words, a distance from a part at which the second conductive layer 420 is in contact with each insulator 200 to each upper electrode 300 is shorter than a distance from the upper part of the first conductive layer 410 to each upper electrode 300.

Since the first conductive layer 410 and the second conductive layer 420 decrease the distance through which the electrical signal passes the lower electrode 100, energy loss generated by electrical signal while passing each upper electrode 300 and lower electrode 100 is reduced whereby the quality factor Q of each capacitor is improved.

A third conductive layer (not shown) may be formed on a lower surface of the lower electrode 100 to function as the third conductive layer of the second embodiment.

Figure 12:
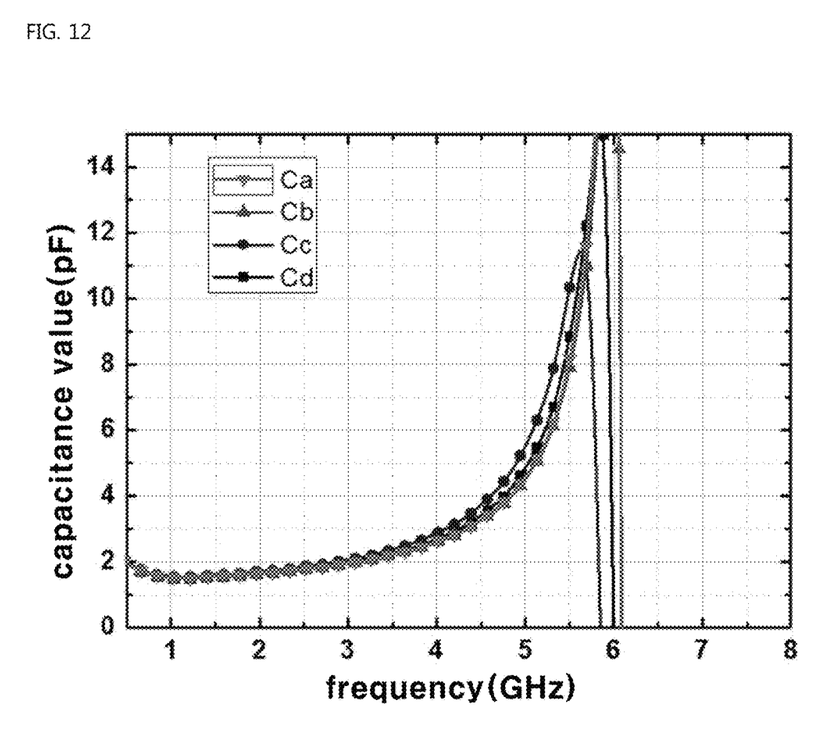
FIG. 12 is a graph showing electric capacities of MIS capacitors according to the embodiments of the present invention.
Figure 13:
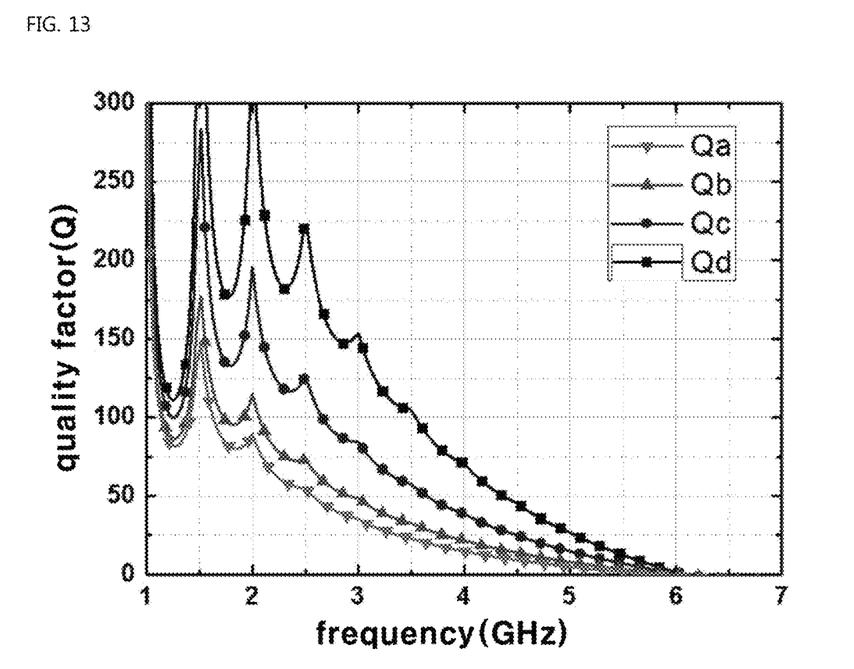
FIG. 13 is a graph showing quality factors Q of the MIS capacitors according to the embodiments of the present invention.

FIG. 12 is a graph showing electric capacities of MIS capacitors according to the embodiments of the present invention, and FIG. 13 is a graph showing quality factors Q of the MIS capacitors according to the embodiments of the present invention.

In FIG. 12 and FIG. 13, Ca and Qa show a capacitance value and a quality factor of a conventional MIS capacitor, Cb and Qb show a capacitance value and a quality factor of a MIS capacitor according to a first embodiment of the present invention, Cc and Qc show a capacitance value and a quality factor of an MIS capacitor according to the second embodiment of the present invention, and Cd and Qd show a capacitance value and a quality factor of a metal-insulator-metal (MIM) capacitor.

As shown in FIG. 12, capacitance values of the conventional MIS capacitor Ca, the MIS capacitor Cb or Cc according to the first embodiment or the second embodiment of the present invention, and the MIM capacitor Cd are similar in an area equal to or less than a 5 GHz frequency. This means that the capacitance value of the MIS capacitor Cb or Cc according to the first embodiment or the second embodiment of the present invention is not small compared with the capacitance value of the conventional MIS capacitor Ca or the MIM capacitor Cd.

As shown in FIG. 13, in an area within a 3 GHz frequency, the quality factor Qa of the conventional MIS capacitor is 35, the quality factor Qb of the MIS capacitor according to the first embodiment of the present invention is 48, the quality factor Qc of the MIS capacitor according to the second embodiment of the present invention is 84, and the quality factor Qd of the MIM capacitor is about 153.

The quality factor Qb of the MIS capacitor according to the first embodiment of the present invention is about 30% higher than the quality factor Qa of the conventional MIS capacitor, and the quality factor Qc of the MIS capacitor according to the second embodiment of the present invention is about 125% higher than the quality factor Qa of the conventional MIS capacitor.

Accordingly, embodiments of the present invention provide an MIS capacitor having a capacitance value similar to a capacitance value of the conventional MIS capacitor or MIM capacitor, and having a quality factor Q higher than the quality factor Q of the conventional MIS capacitor in a high frequency area of 3 GHz.

Although a preferred embodiment of the present invention has been described for illustrative purposes, those skilled in the art will appreciate that various modifications, additions and substitutions are possible, without departing from the scope and spirit of the invention as disclosed in the accompanying claims.

Accordingly, such variations and modifications should also be understood as falling within the scope of the present invention

What is claimed is:

1. An MIS capacitor, comprising:
   a lower electrode formed of a semiconductor substrate having electrical conductivity and through which an electrical signal passes at a lower surface thereof, wherein the lower electrode has the lower surface, an upper surface substantially parallel to the lower surface, and a side surface formed between the lower surface and the upper surface and connecting an edge of the lower surface and an edge of the upper surface;
an insulating layer formed on the lower electrode;
an upper electrode formed on the insulating layer and through which the electrical signal passes at an upper surface thereof; and
a first conductive layer formed on the side surface of the lower electrode so that the electrical signal passing the lower surface and the upper surface of the lower electrode passes along the side surface of the lower electrode,
wherein the first conductive layer has electro conductivity higher than the electro conductivity of the lower electrode.

2. The MIS capacitor of claim 1, wherein the insulating layer is formed to have an area identical to an area of the lower electrode, the upper electrode is formed to have an area smaller than the area of the insulating layer, and the first conductive layer is configured to extend to a side surface of the insulating layer.

3. The MIS capacitor of claim 2, further comprising a third conductive layer connected to the first conductive layer and formed on the lower surface of the lower electrode so that the electrical signal passes therethrough.

4. The MIS capacitor of claim 2, wherein the insulating layer is formed to have an area smaller than the area of the lower electrode, and the MIS capacitor further includes: a second conductive layer formed on an area of the upper surface of the lower electrode on which the insulating layer is not formed, and electrically connected to the first conductive layer so that the electrical signal flowing along the first conductive layer flows to the upper electrode by passing along the upper surface of the lower electrode, wherein
the second conductive layer has electro conductivity higher than the electro conductivity of the lower electrode.

5. The MIS capacitor of claim 4, further comprising a third conductive layer connected to the first conductive layer, and formed on the lower surface of the lower electrode so that the electrical signal passes therethrough.

6. The MIS capacitor of claim 2, wherein the upper electrode comprises a plurality of upper electrodes formed on the insulating layer such that the upper electrodes are spaced apart from each other.

7. The MIS capacitor of claim 6, wherein the insulating layer comprises a plurality of insulators formed on the lower electrode such that the insulators are spaced apart from each other, and at least one upper electrode is formed on each of the plurality of insulators.

8. The MIS capacitor of claim 7, further comprising a second conductive layer formed on an area of the upper surface of the lower electrode on which the insulating layer is not formed, and electrically connected to the first conductive layer so that the electrical signal flowing along the first conductive layer flows to the upper electrode by passing along the upper surface of the lower electrode, wherein the second conductive layer has electro conductivity higher than the electro conductivity of the lower electrode.

9. The MIS capacitor of claim 8, further comprising a third conductive layer connected to the first conductive layer, and formed on the lower surface of the lower electrode so that the electrical signal passes therethrough.

10. The MIS capacitor of claim 6, further comprising a third conductive layer connected to the first conductive layer, and formed on the lower surface of the lower electrode so that the electrical signal passes therethrough.

11. The MIS capacitor of claim 1, wherein the first conductive layer is formed of a metal or metal alloy.

12. The MIS capacitor of claim 11, wherein the first conductive layer is formed of Cu, Au, or Al.

* * * * *